United States Patent
Pal

(10) Patent No.: US 11,665,963 B1
(45) Date of Patent: May 30, 2023

(54) WASTE HEAT CAPTURE USING TAIL CONE OF A GAS TURBINE ENGINE

(71) Applicant: Hamilton Sundstrand Corporation, Charlotte, NC (US)

(72) Inventor: Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/726,624

(22) Filed: Apr. 22, 2022

(51) Int. Cl.
| | | |
|---|---|---|
| H10N 10/13 | (2023.01) | |
| F02K 1/82 | (2006.01) | |
| H01L 35/30 | (2006.01) | |

(52) U.S. Cl.
CPC .............. *H01L 35/30* (2013.01); *F02K 1/822* (2013.01)

(58) Field of Classification Search
CPC ... F02K 1/04; F02K 1/78; F02K 1/822; H01L 35/30
See application file for complete search history.

(56) References Cited

U.S. PATENT DOCUMENTS

| | | | | |
|---|---|---|---|---|
| 3,693,880 A * | 9/1972 | Versaw | ................... | F02K 1/825 60/770 |
| 8,962,968 B2 | 2/2015 | Brillet | | |
| 9,388,740 B2 | 7/2016 | Kwok et al. | | |
| 10,208,641 B2 | 2/2019 | Peck, Jr. et al. | | |
| 10,308,367 B2 | 6/2019 | Akin | | |
| 11,015,509 B2 | 5/2021 | Armatorio et al. | | |
| 2009/0159110 A1* | 6/2009 | Kwok | ..................... | H01L 35/30 136/205 |
| 2010/0263700 A1* | 10/2010 | Teraki | ..................... | H01L 35/32 136/200 |
| 2012/0118345 A1* | 5/2012 | Stoia | ......................... | F02C 6/18 136/205 |
| 2013/0205798 A1* | 8/2013 | Kwok | ....................... | F02K 1/82 60/783 |
| 2016/0123185 A1* | 5/2016 | Le Pache | .................. | F01D 5/02 417/53 |
| 2017/0145892 A1* | 5/2017 | Peck, Jr. | ................. | F23R 3/002 |
| 2019/0115518 A1* | 4/2019 | Kacprowski | ............ | F01D 25/14 |
| 2021/0310411 A1* | 10/2021 | Kelford | .................... | F02K 1/822 |

FOREIGN PATENT DOCUMENTS

JP        2009293390 A        12/2009

* cited by examiner

*Primary Examiner* — Jason H Duger
(74) *Attorney, Agent, or Firm* — Cantor Colburn LLP

(57) ABSTRACT

A waste heat capture system that can be used with at least a gas turbine engine. The system includes: an air scoop connected to a first component, the air scoop configured to direct air from a first duct to an interior compartment of the first component; a second duct along an exterior of the first component; and a thermoelectric material connected to an interior surface of the first component. The interior compartment of the first component is on a first side of the thermoelectric material and the exterior of the first component is on a second side of the thermoelectric material. The first duct is configured to receive air having a first temperature range, and the second duct is configured to receive air having a second temperature range, wherein the second temperature range is an order of magnitude higher than the first temperature range.

20 Claims, 4 Drawing Sheets

WASTE HEAT CAPTURE USING TAIL CONE OF A GAS TURBINE ENGINE

BACKGROUND

The present invention generally relates to waste heat capture, and more specifically to, waste heat capture using tail cone of a gas turbine engine.

An aircraft gas turbine engine of the conventional turbofan type generally includes a forward bypass fan and a low pressure compressor, a middle core engine, and an aft low pressure turbine all located along a common longitudinal axis. Air flows into the engine at an inner diameter and an outer diameter of the engine. Air entering through the outer diameter of the engine exits the rear of the engine at the outer diameter as a relatively low temperature gas stream after flowing through the bypass fan. Airflow entering the inner diameter of the engine enters a high pressure compressor driven by a high pressure turbine to compress the air to a high pressure. This high pressure air is then mixed with fuel in a combustor and ignited to form a relatively high temperature gas stream. The high temperature gas stream flows axially aft to rotatably drive the high pressure turbine which rotatably drives the high pressure compressor through the high pressure shaft. The high temperature gas stream leaving the high pressure turbine is expanded through the low pressure turbine which rotatably drives the bypass fan and low pressure compressor through a low pressure shaft. The high temperature gas stream exits the rear of the engine at the inner diameter from the low pressure turbine and flows over a tailcone. The tailcone is made of titanium or other metal to withstand the elevated temperatures of the high temperature gas stream.

BRIEF DESCRIPTION

Embodiments of the present invention are directed to a turbine engine. A non-limiting example of the turbine engine includes a tail cone, a fan that drives air along a bypass flow path in a bypass duct and a core flow path in a compression duct. The core flow path flows around an exterior surface of the tail cone. The engine also includes an air scoop connected to the tail cone, the air scoop configured to direct air from the bypass duct to an interior compartment of the tail cone and a thermoelectric material connected to an interior surface of the tail cone. The interior compartment of the tail cone is on a first side of the thermoelectric material, wherein the bypass flow path comprises air having a first temperature range, and wherein the core flow path is confirmed to receive air having a second temperature range, wherein the second temperature range is an order of magnitude higher than the first temperature range.

In addition to one or more of the features described above, or as an alternative to any of the foregoing embodiments, a temperature differential is created in the thermoelectric material based on a temperature difference between the bypass flow path on the first side of the thermoelectric material and the core flow path on the exterior surface of the tail cone.

In addition to one or more of the features described above, or as an alternative to any of the foregoing embodiments, the temperature differential causes an electrical voltage to be generated in the thermoelectric material.

In addition to one or more of the features described above, or as an alternative to any of the foregoing embodiments, the engine can further include: an electrical component connected to the thermoelectric material.

In addition to one or more of the features described above, or as an alternative to any of the foregoing embodiments, the thermoelectric material is conformally connected to the interior of the tail cone.

In addition to one or more of the features described above, or as an alternative to any of the foregoing embodiments, the air scoop comprises titanium.

In addition to one or more of the features described above, or as an alternative to any of the foregoing embodiments, the turbine can further include: an insulation layer between the exterior surface of the tail cone and the thermoelectric material.

In addition to one or more of the features described above, or as an alternative to any of the foregoing embodiments, the insulation layer comprises an electrically insulative and thermally conducting material.

In addition to one or more of the features described above, or as an alternative to any of the foregoing embodiments, the tail cone comprises an exit port for the interior compartment.

In addition to one or more of the features described above, or as an alternative to any of the foregoing embodiments, the thermoelectric material comprises n-doped and p-doped semiconductors.

Also disclosed is a waste heat capture system that includes an air scoop connected to a first component, the air scoop configured to direct air from a first duct to an interior compartment of the first component, a second duct along an exterior of the first component; and a thermoelectric material connected to an interior surface of the first component. The interior compartment of the first component is on a first side of the thermoelectric material and the exterior of the first component is on a second side of the thermoelectric material. The first duct is configured to receive air having a first temperature range, and wherein the second duct is configured to receive air having a second temperature range, wherein the second temperature range is an order of magnitude higher than the first temperature range.

In addition to one or more of the features described above, or as an alternative to any of the foregoing system embodiments, a temperature differential is created in the thermoelectric material based on a temperature difference between the air in the first duct on the first side of the thermoelectric material and the air in the second duct on the exterior surface of the first component.

In addition to one or more of the features described above, or as an alternative to any of the foregoing system embodiments, the temperature differential causes an electrical voltage to be generated in the thermoelectric material.

In addition to one or more of the features described above, or as an alternative to any of the foregoing system embodiments, the system can further includes an electrical component connected to the thermoelectric material.

In addition to one or more of the features described above, or as an alternative to any of the foregoing system embodiments, the thermoelectric material is conformally connected to the interior of the first component.

In addition to one or more of the features described above, or as an alternative to any of the foregoing system embodiments, the first component comprises a tail cone in a turbine engine.

In addition to one or more of the features described above, or as an alternative to any of the foregoing system embodiments, the air scoop comprises titanium.

In addition to one or more of the features described above, or as an alternative to any of the foregoing system embodiments, the system can further include an insulation layer between the exterior surface of the tail cone and the thermoelectric material.

In addition to one or more of the features described above, or as an alternative to any of the foregoing system embodiments, the first component comprises an exit port for the interior compartment.

In addition to one or more of the features described above, or as an alternative to any of the foregoing system embodiments, the thermoelectric material comprises n-doped and p-doped semiconductors.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Figure 1:
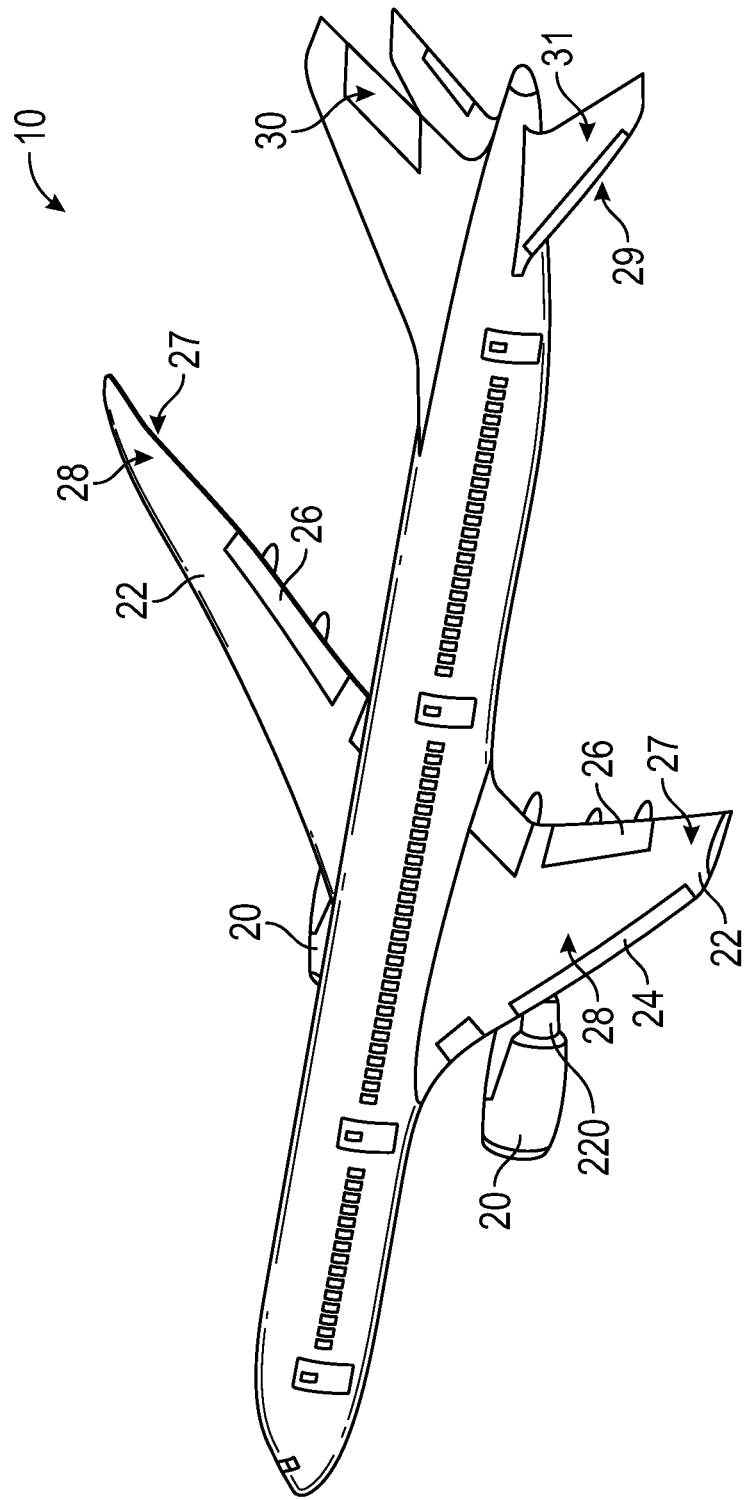
FIG. 1 is a perspective view of an aircraft that may incorporate embodiments of the present disclosure.

FIG. 1 illustrates an example of a commercial aircraft 10 having aircraft engines 20 that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. It will be understood that the slats 24 and/or the flaps 26 can include one or more slat/flap panels that move together. The aircraft 10 also includes a waste heat capture system 220 (described in greater detail in FIG. 3) which allows for utilization of waste heat for electrical power on board the aircraft 10.

Turning now to an overview of technologies that are more specifically relevant to aspects of the disclosure, the concept of a fully electric aircraft (FEA) has been proposed in the past. However, to achieve a FEA, the technological space must first contend with a more electric aircraft (MEA). In the MEA, functionality that has previously been achieved utilizing a pneumatic and/or hydraulic system can now be replaced fully or partially by an electric system. A few examples where the previous systems can be substituted for an electric system include, but are not limited to, flight controls, fuel pumps, oil pumps, cooling pumps, landing system, cargo and air management systems, and the like. These electric systems require power supplied from various generators and/or battery systems on the aircraft. Since these power systems are a necessity, new ways of generating power on board the aircraft are required.

Figure 2:
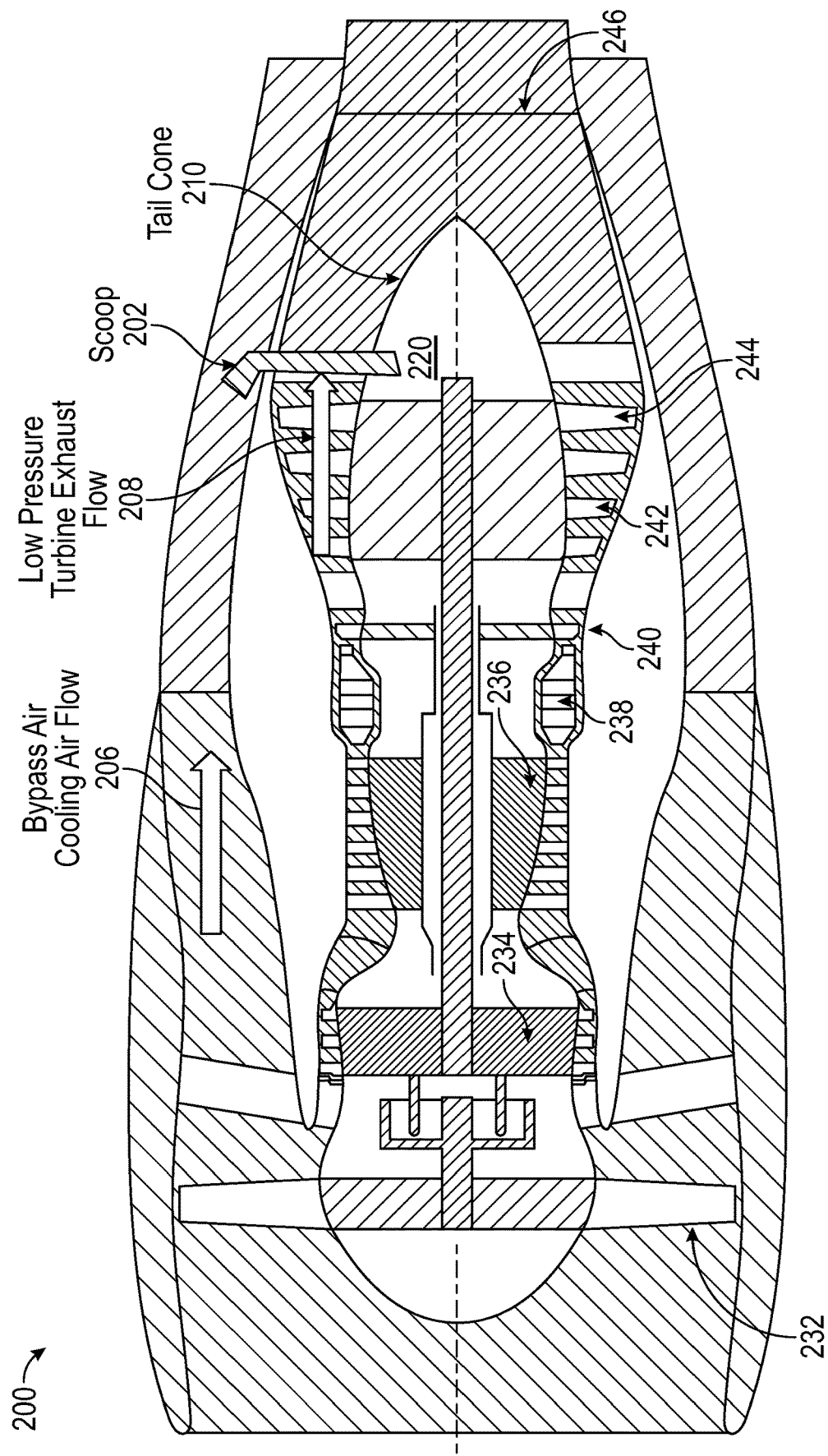
FIG. 2 is a perspective view of a ducted fan gas turbine engine with a waste heat capture system according to one or more embodiments.

In one or more embodiments, systems described herein provide for a thermoelectric generator generates electrical power from waste heat capture within a gas turbine engine. FIG. 2 is a perspective view of a ducted fan gas turbine engine with a waste heat capture system according to one or more embodiments. In one or more embodiments, the gas turbine engine 200 includes, in axial flow series, a fan 232, intermediate pressure compressor 234, a high pressure compressor 236, combustion equipment 238, high, intermediate, and low pressure turbines 240, 242, and 244, respectively and an exhaust nozzle 246. Air can be accelerated by the fan 232 to produce two flows of air, the larger airflow (bypass air cooling air flow) 206 can be exhausted from the engine 200 to provide propulsive thrust through a bypass duct. The smaller airflow (low pressure exhaust flow 208) is directed into the compression duct which flows to an intermediate pressure compressor 234 where it can be compressed and then into the high pressure compressor 236 where further compression can take place. The compressed air then can be mixed with fuel in the combustion equipment 238 and the mixture combusted. The resultant combustion products then can expand through the high, intermediate, and low pressure turbines 240, 242, and 244 respectively before being exhausted to the atmosphere through the exhaust nozzle 246 to provide additional propulsive thrust. The two airflows 206, 208 have a much different temperature range due to the combustion of the compressed air with fuel taking place in the second airflow 208. The first airflow (bypass airflow) 206 has a typical ground temperature of 40-60 C and a typical cruising temperature of 30-50 C. The second airflow (low pressure turbine exhaust) 208 has a typical ground temperature of 540-575 C and a typical cruising temperature of 640-670 C.

In one or more embodiments, the turbine engine 200 includes a waste heat capture system 220 that utilizes thermoelectric material to create a voltage. Thermoelectric materials have the capability of energy conversion between heat and electricity and vice-versa. The thermoelectric materials are used in a thermoelectric generator (TEG) to generate power on an aircraft. A TEG is a solid state device that converts heat flux (temperature differences) directly into electrical energy through the Seebeck effect. In one or more embodiments, the turbine engine 200 includes a tail cone 210. The tail cone 210 is used to make the exhaust air divergent which reduces the flow velocity of the exhaust air and increase thrust due to the smoothening of the air flow out of the exhaust nozzle 246. The tail cone 210 is typically hollow and constructed using a material such as titanium or other metal capable of withstanding an elevated temperature. As mentioned above, for a TEG to operate, there needs to be a temperature differential (heat flux) to convert heat into an electrical energy through the Seebeck effect. The turbine engine 200 includes a scoop 202 configured to direct air from the bypass air flow 206 into the tail cone 210 (to be shown in more detail in FIG. 3). Given the differences in temperatures between the bypass airflow 206 and the turbine exhaust airflow 208, a TEG is able to operate and produce a voltage.

Figure 3:
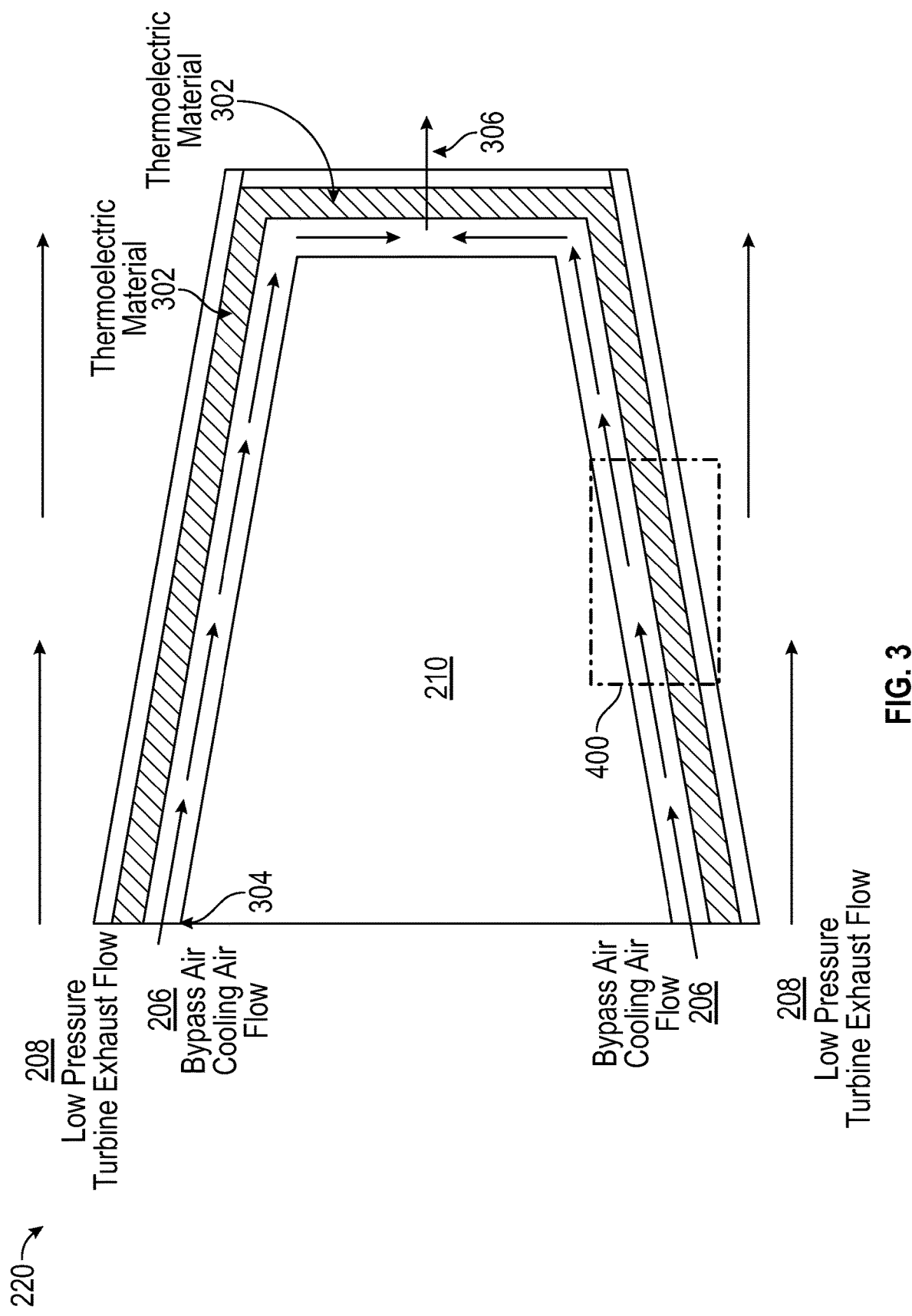
FIG. 3 depicts a waste heat capture system using a thermoelectric generator according one or more embodiments.

FIG. 3 depicts a waste heat capture system using a thermoelectric generator according one or more embodiments. The waste heat capture system 220 includes a tail cone 210 of the turbine engine 200 (from FIG. 2). The tail cone 210 is typically made of titanium or another metal capable of withstanding high temperatures. The air scoop 202 (from FIG. 2) is configured to redirect the bypass air flow 206 into an interior compartment 304 of the tail cone 210 and through an exit port 306. In one or more embodiments, the scoop 202 is a titanium fairing that can be curved to better redirect the cooler air flow from the bypass airflow 206 into the tail cone 210 and interior compartment 304.

As mentioned before, this bypass airflow 206 has a temperature range of 30-60 C depending on the location of the aircraft. The higher temperature air flow 208 (low pressure turbine exhaust flow) continues to flow around the exterior of the tail cone 210. In one or more embodiments, the waste heat capture system 220 includes a thermoelectric material 302 that is conformally connected to an interior surface of the tail cone 210 housing. This configuration has the effect of a high temperature air flow (208) on one side of the thermoelectric material 302 and a lower temperature air flow 206 on an opposite side of the thermoelectric material 302. The thermoelectric materials 302 include materials of different Seebeck coefficients (e.g., p-doped and n-doped semiconductors). These p-doped and n-doped semiconductors are sometimes referred to as Peltier cells. The thermoelectric material 302 experiences a temperature gradient across two junctions (cold junction and hot junction). The thermoelectric material generates a potential difference corresponding to the temperature gradient. As this process continues, the temperature at the hot junction and the cold junctions are maintained nearly at the low pressure turbine exhaust and fan bypass exhaust temperatures respectively. Terminal voltage and output power are a function of the temperature difference across the junctions. The Peltier cells can be connected in series or parallel configurations to make the thermoelectric material 302 match the required voltage and current output or the heat transfer across the junctions. Thus, this thermoelectric material 302 can be connected to electrical components for usage as a power source/generator called a thermoelectric generator (TEG). In addition to the energy generated, the TEG also cools the housing of the tail cone 210 through thermoelectric cooling (Peltier effect). The electrical energy generated by the TEG can be utilized for multiple applications including, but not limited to, powering up on board sensors, feeding back to a DC bus, and the like. Additionally, power converters can be used to boost the voltage to higher voltage and transfer on higher voltage bus.

Figure 4:
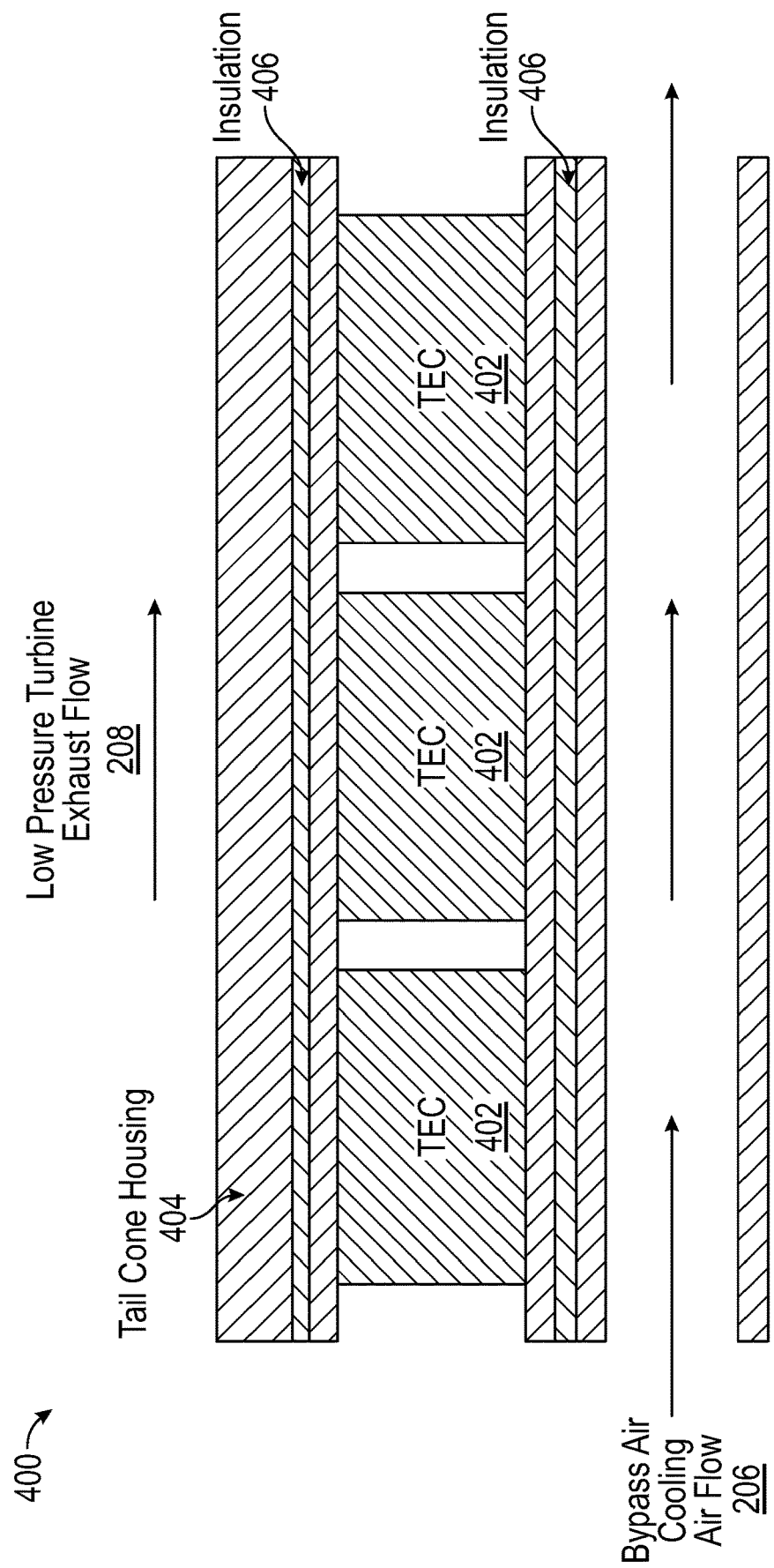
FIG. 4 depicts a side view of a cross section of the waste heat capture system according to one or more embodiments.

FIG. 4 depicts a side view of a cross section of the waste heat capture system according to one or more embodiments. The cross section 400 includes the tail cone housing 404 having a TEG 402 that includes the thermoelectric material. These TEG 402 can be connected to an electrical component to generate a voltage. Above the TEG 402 and above the tail cone housing 404 is the airflow 208 from the exhaust air of the turbine engine. The redirected cooler airflow 206 is under the TEG 402 thus creating a temperature gradient for use by the TEG 402 to generate a voltage. In one or more embodiments, the tail cone housing 404 can include an electrically insulating and thermally conducting material/ layers 406. The electrical insulation 406 can be a material such as 30 mil Nomex or Kapton or combination, capable of withstanding high temperatures. As described above, the high temperature turbine exhaust airflow 208 along with the bypass air flow 206 creates a temperature gradient for the TEG 402 to generate a voltage.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A gas turbine engine comprising:
   a tail cone;
   a fan, wherein the fan drives air along a bypass flow path in a bypass duct and a core flow path in a compression duct, wherein the core flow path flows around an exterior surface of the tail cone;
   an air scoop connected to the tail cone, the air scoop configured to direct air from the bypass duct to an interior compartment of the tail cone; and
   a thermoelectric material connected to an interior surface of the tail cone, wherein the interior compartment of the tail cone is on a first side of the thermoelectric material, wherein the bypass flow path comprises air having a first temperature range, and wherein the core flow path comprises air having a second temperature range, wherein the second temperature range is an order of magnitude higher than the first temperature range.

2. The gas turbine engine of claim 1, wherein a temperature differential is created in the thermoelectric material based on a temperature difference between the bypass flow path on the first side of the thermoelectric material and the core flow path on the exterior surface of the tail cone.

3. The gas turbine engine of claim 2, wherein the temperature differential causes an electrical voltage to be generated in the thermoelectric material.

4. The gas turbine engine of claim 3, further comprising: an electrical component connected to the thermoelectric material.

5. The gas turbine engine of claim 1, wherein the thermoelectric material is conformally connected to an interior of the tail cone.

6. The gas turbine engine of claim 1, wherein the air scoop comprises titanium.

7. The gas turbine engine of claim 1, further comprising: an insulation layer between the exterior surface of the tail cone and the thermoelectric material.

8. The gas turbine engine of claim 7, wherein the insulation layer comprises an electrically insulative and thermally conducting material.

9. The gas turbine engine of claim 1, wherein the tail cone comprises an exit port for the interior compartment.

10. The gas turbine engine of claim 1, wherein the thermoelectric material comprises n-doped and p-doped semiconductors.

11. A waste heat capture system comprising:
an air scoop connected to a first component, the air scoop configured to direct air from a first duct to an interior compartment of the first component;
a second duct along an exterior of the first component; and
a thermoelectric material connected to an interior surface of the first component, wherein the interior compartment of the first component is on a first side of the thermoelectric material, wherein the exterior of the first component is on a second side of the thermoelectric material; and
wherein the first duct comprises air having a first temperature range, and wherein the second duct comprises air having a second temperature range, wherein the second temperature range is an order of magnitude higher than the first temperature range.

12. The waste heat capture system of claim 11, wherein a temperature differential is created in the thermoelectric material based on a temperature difference between the air in the first duct on the first side of the thermoelectric material and the air in the second duct on an exterior surface of the first component.

13. The waste heat capture system of claim 12, wherein the temperature differential causes an electrical voltage to be generated in the thermoelectric material.

14. The waste heat capture system of claim 13, further comprising: an electrical component connected to the thermoelectric material.

15. The waste heat capture system of claim 11, wherein the thermoelectric material is conformally connected to the interior of the first component.

16. The waste heat capture system of claim 11, wherein the first component comprises a tail cone in a turbine engine.

17. The waste heat capture system of claim 11, wherein the air scoop comprises titanium.

18. The waste heat capture system of claim 11, further comprising: an insulation layer between the exterior of the first component and the thermoelectric material.

19. The waste heat capture system of claim 11, wherein the first component comprises an exit port for the interior compartment.

20. The waste heat capture system of claim 11, wherein the thermoelectric material comprises n-doped and p-doped semiconductors.

* * * * *